(12) United States Patent
Hanapi et al.

(10) Patent No.: US 11,551,964 B2
(45) Date of Patent: Jan. 10, 2023

(54) SEMICONDUCTOR WAFER TRANSFER ARM

(71) Applicant: Western Digital Technologies, Inc., San Jose, CA (US)

(72) Inventors: Ridzuan Hanapi, Bukit Mertajam (MY); Muhammad Alif Shafiq Arof, Batu Kawan (MY); Marc Jan Apilado, Batu Kawan (MY)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/362,330

(22) Filed: Jun. 29, 2021

(65) Prior Publication Data

US 2022/0157640 A1 May 19, 2022

Related U.S. Application Data

(60) Provisional application No. 63/114,753, filed on Nov. 17, 2020.

(51) Int. Cl.
*H01L 21/687* (2006.01)
(52) U.S. Cl.
CPC .............................. *H01L 21/68707* (2013.01)
(58) Field of Classification Search
CPC ......... H01L 21/68707; H01L 21/67742; H01L 21/6838; B25J 9/042; B25J 9/043; B25J 15/0683
See application file for complete search history.

(56) References Cited

U.S. PATENT DOCUMENTS

| 4,566,726 A * | 1/1986 | Correnti ................ B66C 1/0268 414/744.1 |
| 7,823,941 B2 * | 11/2010 | Caldwell ............... B66C 1/0262 294/64.3 |
| 2002/0050322 A1 * | 5/2002 | Kunisawa ........... H01L 21/6838 156/345.11 |
| 2006/0232085 A1 * | 10/2006 | Nagasawa ............ B25J 15/0616 294/189 |
| 2021/0362351 A1 * | 11/2021 | Hirose ................... G02B 5/284 |

FOREIGN PATENT DOCUMENTS

JP 2016159405 A * 9/2016 .......... B25J 15/0683

* cited by examiner

*Primary Examiner* — Gerald McClain
(74) *Attorney, Agent, or Firm* — Michael Best & Friedrich LLP (57) ABSTRACT

A semiconductor wafer transfer arm includes, in one embodiment, a mechanical arm and a contact pad including contact points. The contact points are configured to secure a semiconductor wafer at a non-active area of the semiconductor wafer and offset the contact pad from an active area of the semiconductor wafer by a predetermined distance. The transfer arm prevents foreign material from contacting the wafer and thus reduces instances of die cracking caused by foreign material during a semiconductor wafer transfer process.

18 Claims, 6 Drawing Sheets

SEMICONDUCTOR WAFER TRANSFER ARM

CROSS-REFERENCE TO RELATED APPLICATION

This application claims priority to and the benefit of U.S. Provisional Patent Application No. 63/114,753, filed on Nov. 17, 2020, the entire contents of which is incorporated herein by reference.

BACKGROUND

This application relates generally to semiconductor wafers and, more particularly, to transfer arms that transfer semiconductor wafers during device assembly.

Advances in packaging technology with lower die thickness pose challenges during packaging or device assembly, and in particular, challenges during a backgrinding process. Die cracks are the top defect detected in thin semiconductor dies. Die cracks may be formed from a variety of causes, but usually originate from mechanical stresses that are transmitted to the semiconductor wafer and/or die.

Die cracks may be caused by foreign material trapped on the die surface. Such foreign material may be introduced during transfer of the wafer by a contact pad of a transfer arm. The transfer arm is used to transfer the wafer from a positioning table to a grinding chuck table.

The transfer arm does not have an auto cleaning function, so foreign material is not removed from the contact pad of the transfer arm unless the contact pad is manually cleaned. Consequently, the foreign material may pose a risk that every wafer transported by the transfer arm will receive a die crack at the same location as the foreign material (referred to as a "localized die crack").

SUMMARY

The disclosure provides a semiconductor wafer transfer arm including a mechanical arm and a contact pad including a plurality of contact points. The plurality of contact points is configured to secure a semiconductor wafer at non-active areas of the dies of the semiconductor wafer. The plurality of contact points is also configured to offset the contact pad from an active area of the semiconductor dies by a predetermined distance.

The disclosure also provides a semiconductor wafer transfer method. The method includes securing, with a semiconductor wafer transfer arm, a semiconductor wafer at a non-active area of the semiconductor wafer, the semiconductor wafer being at a first location. The method also includes transferring, with the semiconductor wafer transfer arm, the semiconductor wafer to a second location that is different from the first location. The semiconductor wafer transfer arm includes a mechanical arm and a contact pad including a plurality of contact points. The plurality of contact points is configured to secure the semiconductor wafer at the non-active area of the semiconductor wafer, and offset the contact pad from an active area of the semiconductor wafer by a predetermined distance.

In this manner, various aspects of the disclosure provide for improvements in at least the technical fields of packaging and semiconductor device assembly. The foregoing introduction is intended solely to give a general idea of various aspects of the disclosure and does not limit the scope of the disclosure in any way.

DETAILED DESCRIPTION

Conventionally, a transfer arm has a contact pad that is in direct contact with the semiconductor wafer. Once foreign matter is embedded in or trapped on the contact pad, the foreign matter causes mechanical stress on the semiconductor wafer during a pick-and-place operation performed by the transfer arm.

Figure 1:
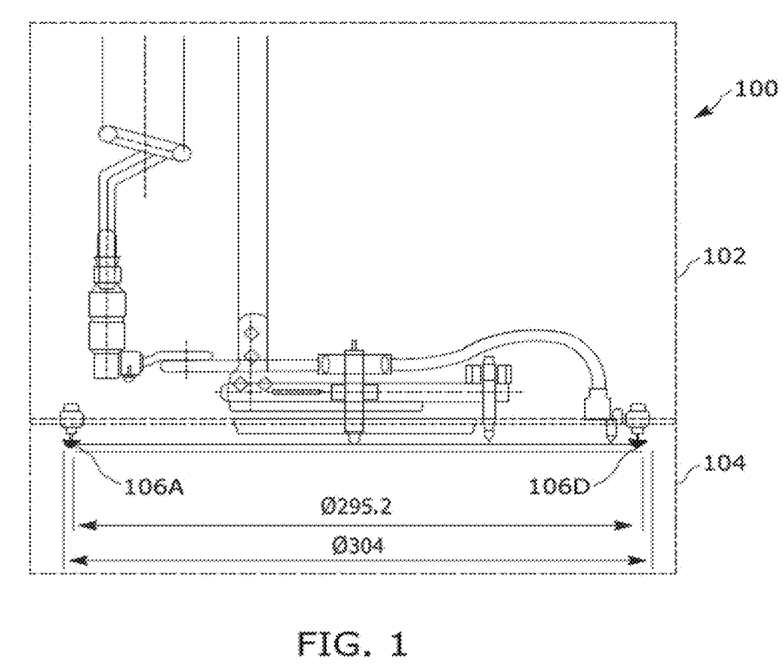
FIG. 1 is diagram illustrating a cross-sectional view of a transfer arm, in accordance with some embodiments of the disclosure.

FIG. 1 is diagram illustrating a cross-sectional view of a transfer arm 100, in accordance with some embodiments of the disclosure. As illustrated in FIG. 1, the transfer arm includes a mechanical arm 102 and a contact pad 104. The contact pad 104, unlike conventional contact pads, has contact points 106A and 106D that correspond to non-active areas of the dies of the semiconductor wafer.

For example, the contact points 106A and 106D of the contact pad 104 may have a width of approximately 0.3 centimeters when the inner diameter of the contact pad 104 is 29.52 centimeters and the outer diameter of the contact pad 104 is 30.4 centimeters. The contact points 106A and 106D may also have a curved length of approximately 12 centimeters when the inner diameter of the contact pad 104 is 29.52 centimeters and the outer diameter of the contact pad 104 is 30.4 centimeters.

The contact points 106A and 106D also have a height of 0.30 centimeters that provides an offset between the contact pad 104 and the active area of the semiconductor wafer. The offset is a predetermined distance between the contact pad 104 and the active area of the dies of the wafer. In some examples, the predetermined distance is the same as the height associated with the contact points 106A and 106D. In other examples, the predetermined distance is different from the height associated with the contact points 106A and 106D. In some examples, the predetermined distance is approximately the same between the contact pad 104 and the active areas of the dies. In other examples, the predetermined distance is not constant between the contact pad 104 and the active areas of the dies.

Figure 2:
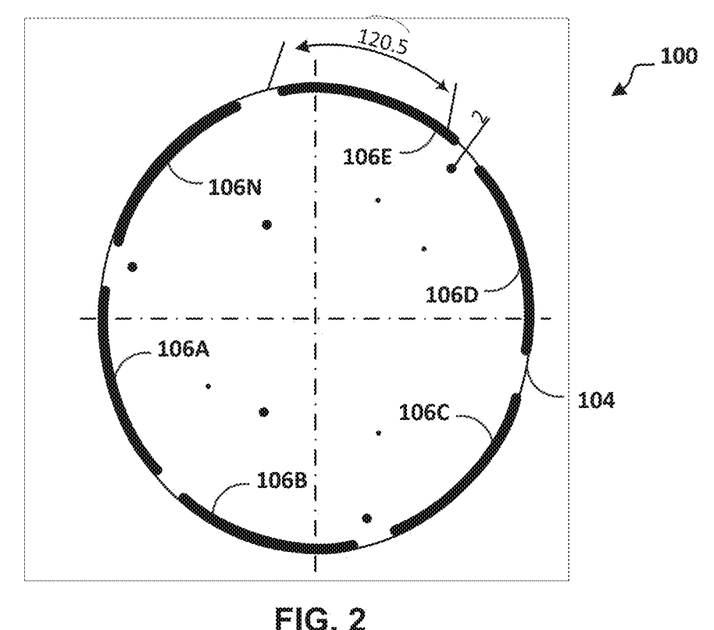
FIG. 2 is diagram illustrating a plan view of a transfer arm, in accordance with some embodiments of the disclosure.

FIG. 2 is a diagram illustrating a plan view of the transfer arm 100, in accordance with some embodiments of the disclosure. As illustrated in FIG. 2, the contact pad 104 is circular and the contact points 106A and 106D are two of a plurality of contact points (e.g., six contact points 106A-106N) that are directly adjacent to the perimeter of the contact pad 104. The six contact points 106A-106N may be comprised of nitrile butadiene rubber (NBR).

In some examples, the contact points 106A-106N may be curved discontinuous sections (also referred to as "contact members") directly adjacent to the perimeter of the contact pad 104. However, in other examples, the contact points 106A-106N may be any shape and located anywhere on the contact pad 104 that corresponds to a non-active area of the semiconductor wafer.

In some examples, the contact pad 104 is a solid circular structure. In other examples, the contact pad 104 is a discontinuous structure that only provides support for the contact points 106A-106N.

Figure 3:
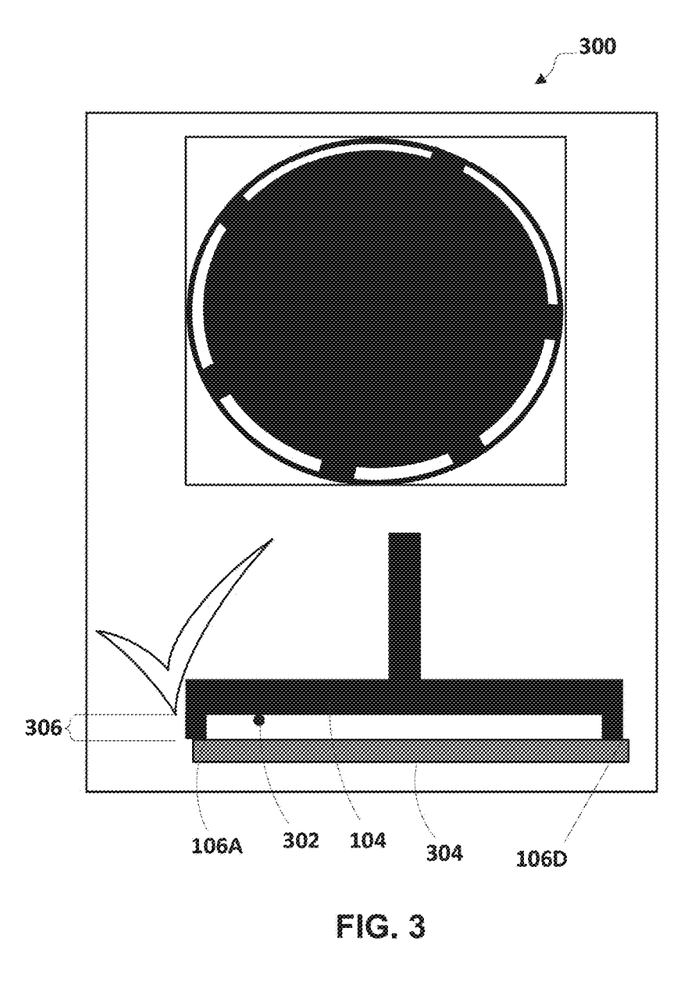
FIG. 3 is a diagram illustrating an example of the transfer arm of FIG. 1 mitigating damage from the foreign matter on a semiconductor wafer, in accordance with various aspects of the present disclosure.

FIG. 3 is a diagram illustrating an example 300 of the contact points 106A and 106D of FIG. 1 mitigating damage from the foreign matter 302 on a semiconductor wafer 304, in accordance with various aspects of the present disclosure. As illustrated in FIG. 3, the contact points 106A and 106D mitigate damage from the foreign matter 302 on the semiconductor wafer 304 by providing an offset 306 that separates an active area of the semiconductor wafer 304 from the contact pad 104.

Figure 4:
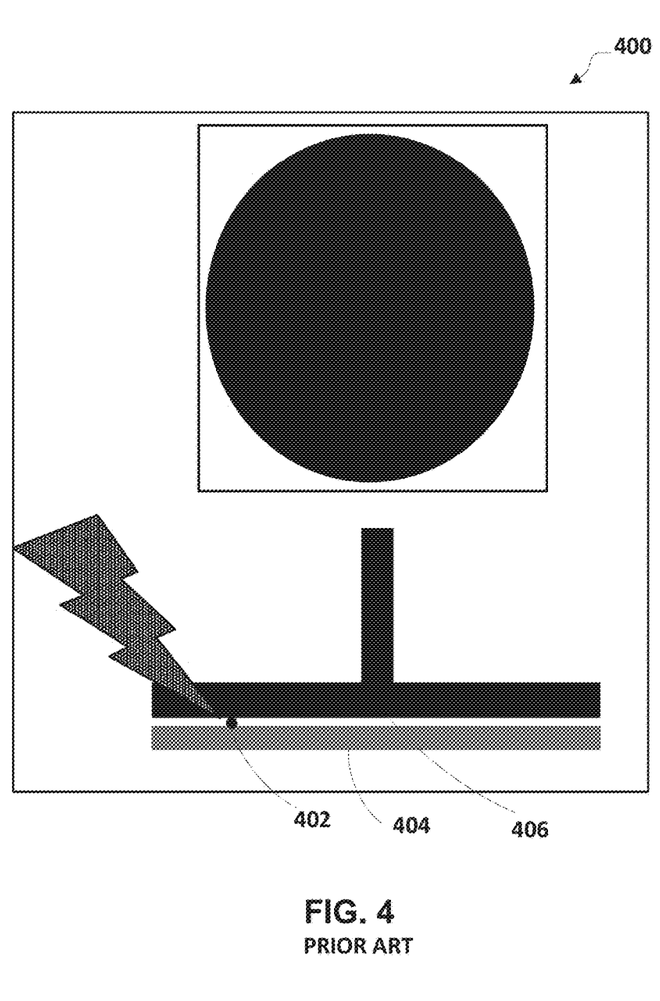
FIG. 4 is a diagram illustrating an example of a conventional transfer arm that cannot mitigate damage from the foreign matter on a semiconductor wafer.

FIG. 4 is a diagram illustrating an example 400 of a conventional transfer arm 406 that allows the foreign matter 402 to contact a semiconductor wafer 404. As illustrated in FIG. 4, the conventional transfer arm 406 cannot mitigate damage from the foreign matter 402 on the semiconductor wafer 404 because the conventional transfer arm 406 cannot provide an offset that separates active areas of the dies of the semiconductor wafer 404 from the contact pad of the conventional transfer arm 406.

Figure 5:
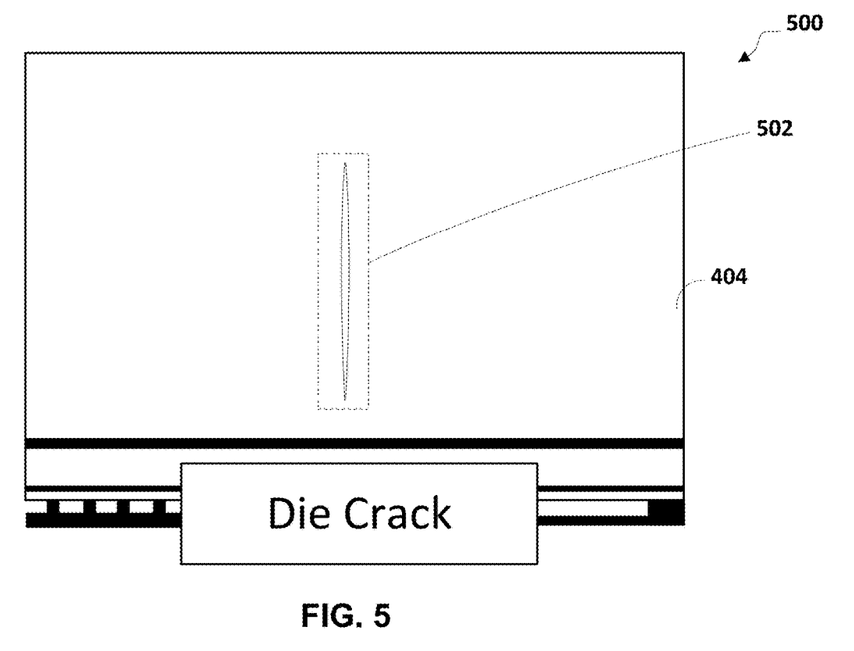
FIG. 5 is a diagram illustrating an example of a localized die crack in a die of the semiconductor wafer of FIG. 4 caused by mechanical stress from the conventional transfer arm of FIG. 4.

FIG. 5 is a diagram illustrating an example 500 of a localized die crack 502 in a die of the semiconductor wafer 404 of FIG. 4 caused by mechanical stress from foreign matter disposed on the wafer 404 by the conventional transfer arm 406 of FIG. 4. As the localized die crack 502 is very small, the localized die crack 502 may escape initial detection and yet impact the viability of the dies.

Figure 6:
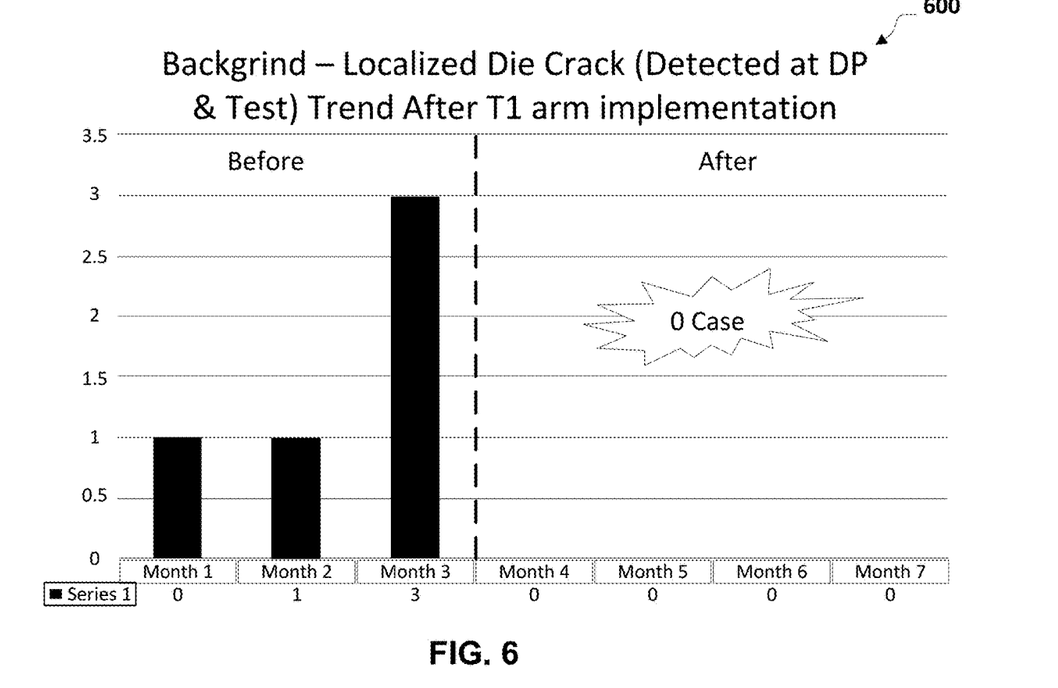
FIG. 6 is a table illustrating a comparison of localized die cracks detected before and after implementation of the transfer arm of FIG. 1, in accordance with some embodiments of the disclosure.

FIG. 6 is a table 600 illustrating a comparison of localized die cracks detected before and after implementation of the transfer arm 100 of FIG. 1, in accordance with some embodiments of the disclosure. As illustrated in FIG. 6, the conventional transfer arm 406 caused one localized die crack in Month 1, one localized die crack in Month 2, and three localized die cracks in Month 3. The transfer arm 100 was implemented beginning in Month 4 and thereafter, no localized die cracks were detected in Months 4-7.

Several advantages are realized by the transfer arm 100 of FIG. 1. First, the transfer arm 100 improves the yield of the semiconductor wafer by reducing or eliminating the localized die crack (or localized die cracks) caused by foreign matter transferred to a wafer by the conventional transfer arm. Second, the transfer arm 100 also reduces the downtime associated with cleaning of the conventional contact pad as well as the downtime associated with necessary die crack detection in the semiconductor wafer. Third, the transfer arm 100 also saves on scrap cost.

Figure 7:
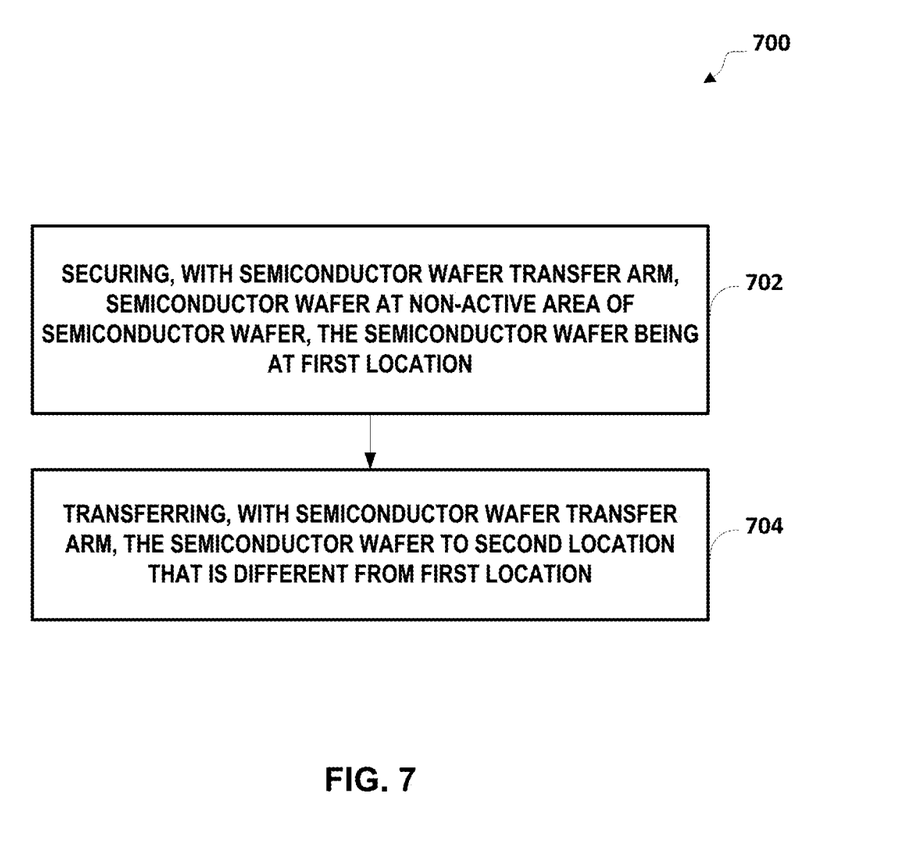
FIG. 7 is a flowchart illustrating a semiconductor wafer transfer method with the transfer arm of FIG. 1, in accordance with some embodiments of the disclosure.

FIG. 7 is a flowchart illustrating a semiconductor wafer transfer method 700 with the transfer arm 100 of FIG. 1, in accordance with some embodiments of the disclosure. The method 700 includes securing, with a semiconductor wafer transfer arm, a semiconductor wafer at a non-active area of the semiconductor wafer, the semiconductor wafer being at a first location (at block 702). The method 700 also includes transferring, with the semiconductor wafer transfer arm, the semiconductor wafer to a second location that is different from the first location (at block 704).

Specifically, the transfer arm 100 picks up the semiconductor wafer from positioning table. During pick up, only a non-active area (e.g., a wafer edge) will be contacted to the wafer. The non-active area is secured as non-active dies in the non-active area (at the semiconductor wafer edge) are not in use for assembly and will be scrapped. The wafer will be placed at grinding table to continue the process.

The semiconductor wafer transfer arm includes a mechanical arm and a contact pad including a plurality of contact points. The plurality of contact points is configured to secure the semiconductor wafer at the non-active area of the semiconductor wafer and offset the contact pad from an active area of the semiconductor wafer by a predetermined distance.

Figure 8:
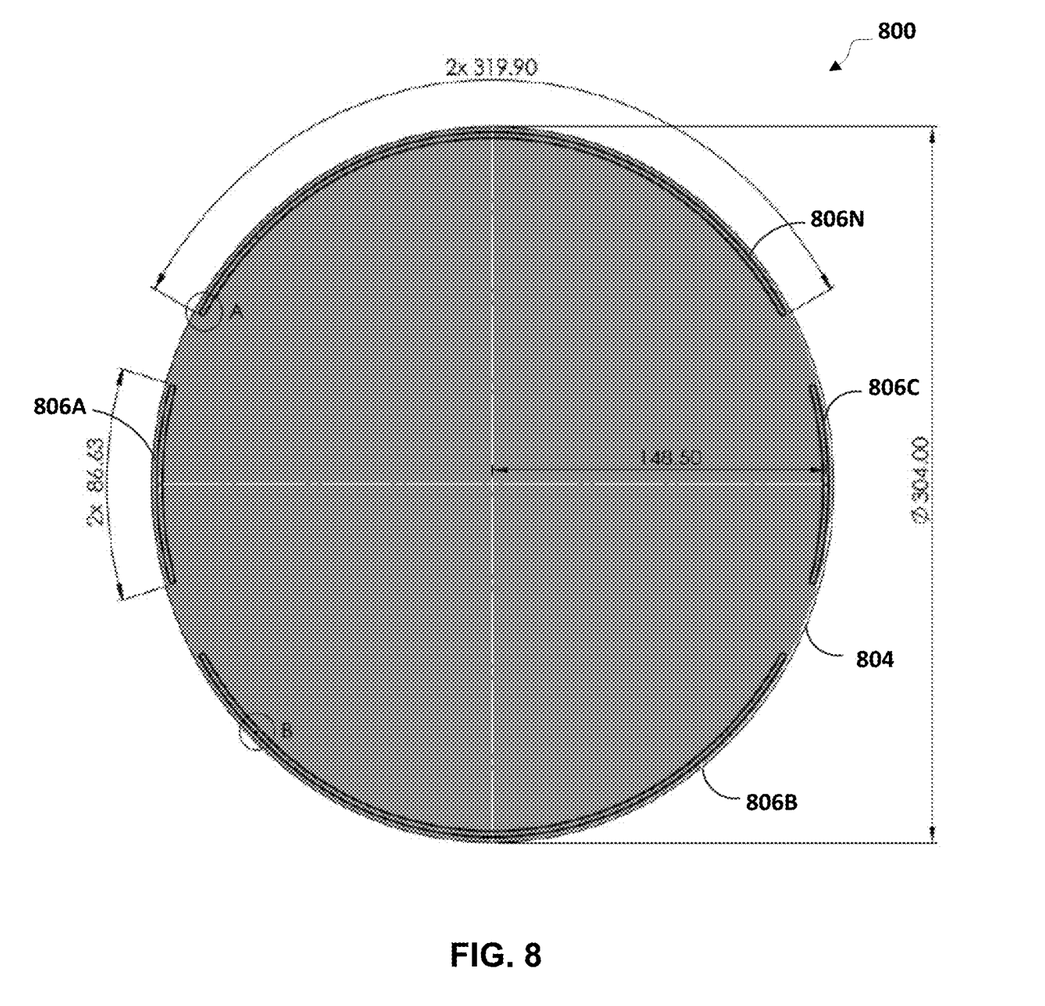
FIG. 8 is diagram illustrating a plan view of a second example of a transfer arm, in accordance with some embodiments of the disclosure.

FIG. 8 is a diagram illustrating a second example of a plan view of the transfer arm 800, in accordance with some embodiments of the disclosure. The transfer arm 800 is similar to the transfer arm 100 of FIG. 1. However, the inner diameter of the transfer arm 800 is 29.7 centimeters instead of 29.5 centimeters.

As illustrated in FIG. 8, the contact pad 804 is circular and the contact points 806A and 806B are two of a plurality of contact points (e.g., four contact points 806A-806N) that are directly adjacent to the perimeter of the contact pad 804.

In some examples, the contact points 806A-806N may be curved discontinuous sections (also referred to as "contact members") directly adjacent to the perimeter of the contact pad 804. However, in other examples, the contact points 806A-806N may be any shape and located anywhere on the contact pad 804 that corresponds to a non-active area of the semiconductor wafer.

In some examples, the contact pad 804 is a solid circular structure. In other examples, the contact pad 804 is a discontinuous structure that only provides support for the contact points 806A-806N.

The contact pad 804, unlike conventional contact pads, has a contact point 806A that corresponds to one or more non-active areas of the dies of the semiconductor wafer.

For example, the contact points 806A-806N of the contact pad 804 may have a width of approximately 0.3 centimeters when the inner diameter of the contact pad 104 is 29.7 centimeters and the outer diameter of the contact pad 804 is 30.4 centimeters. The contact points 806B and 806N individually may also have a curved length of approximately 31.90 centimeters when the inner diameter of the contact pad 104 is 29.7 centimeters and the outer diameter of the contact pad 104 is 30.4 centimeters. The contact points 806A and 806C individually may also have a curved length of approximately 8.66 centimeters when the inner diameter of the contact pad 104 is 29.7 centimeters and the outer diameter of the contact pad 104 is 30.4 centimeters.

The contact points 806A-806N also have a height of 0.30 centimeters that provides an offset between the contact pad 804 and the active area of the semiconductor wafer. The offset is a predetermined distance between the contact pad 804 and the active area of the dies of the wafer. In some examples, the predetermined distance is the same as the height associated with the contact points 806A-806N. In other examples, the predetermined distance is different from the height associated with the contact points 806A-806N. In some examples, the predetermined distance is approximately the same between the contact pad 804 and the active areas of the dies. In other examples, the predetermined distance is not constant between the contact pad 804 and the active areas of the dies.

Figure 9:
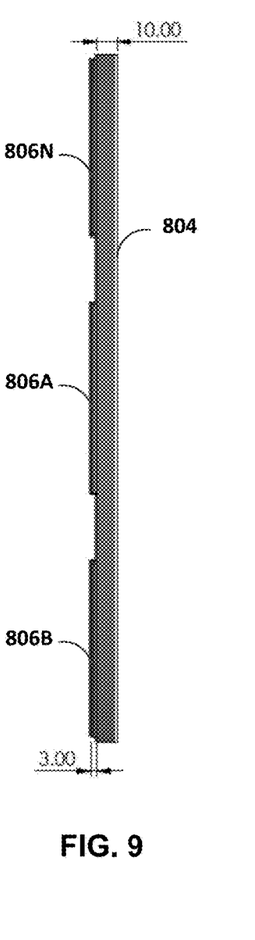
FIG. 9 is diagram illustrating a cross-section view of the transfer arm of FIG. 8, in accordance with some embodiments of the disclosure.

FIG. 9 is diagram illustrating a cross-section view of the transfer arm 800 of FIG. 8, in accordance with some embodiments of the disclosure. In the example of FIG. 9, the contact pad 804 has a height of 1 centimeter and the contact pads 806A-806N have a height of 0.30 centimeters that provides an offset between the contact pads 806A-806N and the active area of the semiconductor wafer.

Figure 10:
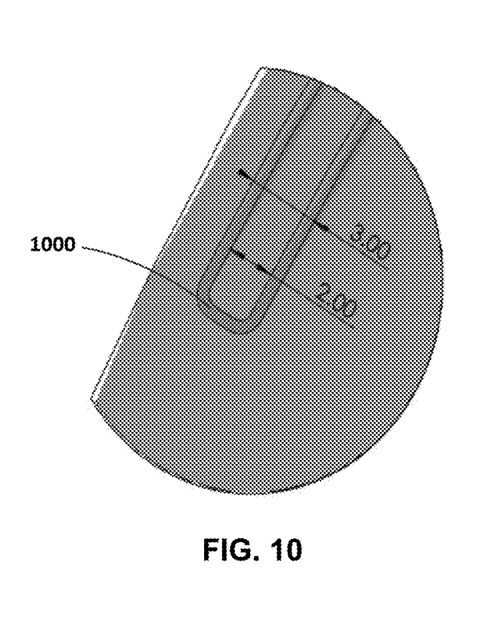
FIG. 10 is diagram illustrating a detailed view of an end of a contact point of the transfer arm of FIG. 8, in accordance with some embodiments of the disclosure.

FIG. 10 is diagram illustrating a detailed view of an end 1000 of a contact point of the transfer arm 800 of FIG. 8, in accordance with some embodiments of the disclosure. As illustrated in FIG. 10, the contact point has an inner gap of 0.2 centimeters and a width of 0.3 centimeters.

Figure 11:
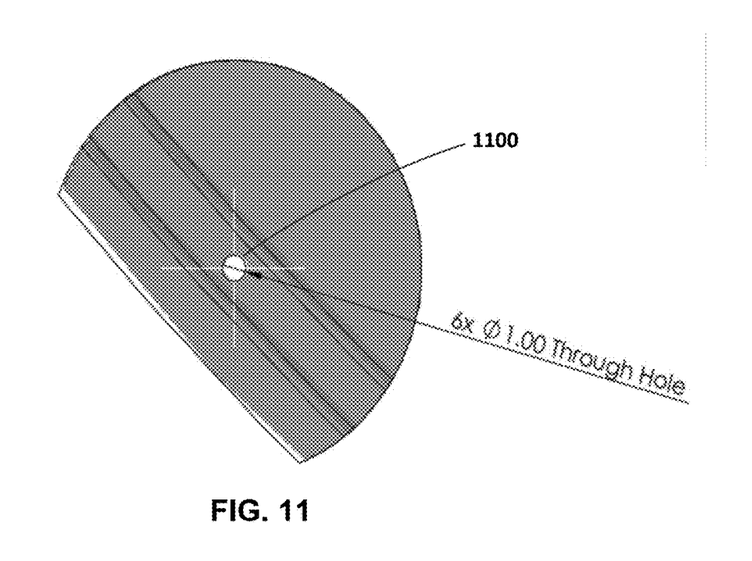
FIG. 11 is diagram illustrating a detailed view of a through hole of a contact point of the transfer arm of FIG. 8, in accordance with some embodiments of the disclosure.

FIG. 11 is diagram illustrating a detailed view of a through hole 1100 of a contact point of the transfer arm 800 of FIG. 8, in accordance with some embodiments of the disclosure. As illustrated in FIG. 10, the through hole 1100 has a diameter of 0.1 centimeter.

In the above description, numerous details are set forth, such as contact pad structures of a semiconductor wafer transfer arm, and the like, in order to provide an understanding of one or more aspects of the present disclosure. It will be readily apparent to one skilled in the art that these specific details are merely exemplary and not intended to limit the scope of this application. This description is intended solely to give a general idea of various aspects of the disclosure and does not limit the scope of the disclosure in any way.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claim is hereby incorporated into the Detailed Description and standing on its own as a separately claimed subject matter.

What is claimed is:

1. A semiconductor wafer transfer arm, comprising:
a mechanical arm; and
a contact pad including a plurality of contact points, the plurality of contact points is configured to
secure a semiconductor wafer at a non-active area of the semiconductor wafer, and
offset the contact pad from an active area of the semiconductor wafer by a predetermined distance,
wherein the plurality of contact points is a plurality of contact members,
wherein each of the plurality of contact members extends along a perimeter of the contact pad,
wherein a gap is located at the perimeter between each pair of the plurality of contact members, and
wherein the plurality of contact points are located directly adjacent to the perimeter of the contact pad.

2. The semiconductor wafer transfer arm of claim 1, wherein the contact pad has a circular shape.

3. The semiconductor wafer transfer arm of claim 2, wherein the perimeter of the contact pad has a diameter of approximately 30.4 centimeters.

4. The semiconductor wafer transfer arm of claim 3, wherein an inner diameter between two of the plurality of contact points is approximately 29.70 centimeters.

5. The semiconductor wafer transfer arm of claim 1, wherein the plurality of contact members includes four curved contact members, wherein each of the four curved contact members extends along a curved portion of the perimeter of the contact pad, and wherein the gap is located at the curved portion of the perimeter between the each pair of the four curved contact members.

6. The semiconductor wafer transfer arm of claim 5, wherein the each of the four curved contact members has a curved length of approximately 31.9 or 8.66 centimeters.

7. The semiconductor wafer transfer arm of claim 5, wherein the each of the four curved contact members has a width of approximately 0.3 centimeters.

8. The semiconductor wafer transfer arm of claim 5, wherein the each of the four curved contact members has a height of approximately 0.3 centimeters that corresponds to the predetermined distance.

9. The semiconductor wafer transfer arm of claim 1, wherein the plurality of contact members includes four contact members, wherein each of the four contact members extends along the perimeter of the contact pad, and wherein the gap is located at the perimeter between the each pair of the four contact members.

10. The semiconductor wafer transfer arm of claim 9, wherein the each of the four contact members comprise nitrile butadiene rubber (NBR) material.

11. A method for transferring a semiconductor wafer, the method comprising:
securing, with a semiconductor wafer transfer arm, a semiconductor wafer at a non-active area of the semiconductor wafer, the semiconductor wafer being at a first location; and transferring, with the semiconductor wafer transfer arm, the semiconductor wafer to a second location that is different from the first location,
wherein the semiconductor wafer transfer arm includes a mechanical arm and a contact pad including a plurality of contact points, the plurality of contact points is configured to
secure the semiconductor wafer at the non-active area of the semiconductor wafer, and
offset the contact pad from an active area of the semiconductor wafer by a predetermined distance,
wherein the plurality of contact points is a plurality of contact members,
wherein each of the plurality of contact members extends along a perimeter of the contact pad,
wherein a gap is located at the perimeter between each pair of the plurality of contact members, and
wherein the plurality of contact points are located directly adjacent to the perimeter of the contact pad.

12. The method of claim 11, wherein the contact pad has a circular shape.

13. The method of claim 12, wherein the perimeter of the contact pad has a diameter of approximately 30.4 centimeters.

14. The method of claim 13, wherein an inner diameter between two of the plurality of contact points is approximately 29.7 centimeters.

15. The method of claim 11, wherein the plurality of contact members includes four curved contact members, wherein each of the four curved contact members extends along a curved portion of the perimeter of the contact pad, and wherein the gap is located at the curved portion of the perimeter between the each pair of the four curved contact members.

16. The method of claim 15, wherein the each of the four curved contact members has a curved length of approximately 31.9 or 8.66 centimeters.

17. The method of claim 15, wherein the each of the four curved contact members has a width of approximately 0.3 centimeters.

18. The method of claim 11, wherein the plurality of contact members includes four contact members, wherein each of the four contact members extends along the perimeter of the contact pad, and wherein the gap is located at the perimeter between the each pair of the four contact members.

* * * * *